US008190204B2

(12) United States Patent
Whitney

(10) Patent No.: US 8,190,204 B2
(45) Date of Patent: May 29, 2012

(54) DIGITAL, WIRELESS PC/PCS MODEM

(76) Inventor: Ray Whitney, Moore Haven, FL (US)

( * ) Notice: Subject to any disclaimer, the term of this patent is extended or adjusted under 35 U.S.C. 154(b) by 3728 days.

(21) Appl. No.: 09/921,375

(22) Filed: Aug. 2, 2001

(65) Prior Publication Data

US 2002/0013162 A1 Jan. 31, 2002

Related U.S. Application Data

(63) Continuation-in-part of application No. 09/273,482, filed on Mar. 22, 1999, now abandoned.

(51) Int. Cl.
*H04B 1/38* (2006.01)
(52) U.S. Cl. .......... 455/557; 455/427; 379/357.01; 379/357.02; 345/1.1; 345/619; 345/581; 348/564; 348/565
(58) Field of Classification Search .......... 455/427, 455/557; 379/357.01, 357.02; 345/1.1, 619, 345/581; 348/564, 565
See application file for complete search history.

(56) References Cited

U.S. PATENT DOCUMENTS

| 4,876,737 | A | * | 10/1989 | Woodworth et al. | 455/12.1 |
|---|---|---|---|---|---|
| 5,428,671 | A | * | 6/1995 | Dykes et al. | 379/93.32 |
| 5,457,601 | A | * | 10/1995 | Georgopulos et al. | 361/679.32 |
| 5,566,226 | A | * | 10/1996 | Mizoguchi et al. | 455/558 |
| 5,646,635 | A | * | 7/1997 | Cockson et al. | 343/702 |
| 5,915,020 | A | * | 6/1999 | Tilford et al. | 455/3.02 |
| 6,088,648 | A | * | 7/2000 | Shah et al. | 701/117 |
| 6,141,062 | A | * | 10/2000 | Hall et al. | 348/584 |
| 6,684,084 | B1 | * | 1/2004 | Phillips | 455/558 |
| 6,724,403 | B1 | * | 4/2004 | Santoro et al. | 715/765 |
| 6,778,519 | B1 | * | 8/2004 | Harrell et al. | 370/342 |
| 6,917,646 | B2 | * | 7/2005 | Chianale et al. | 375/222 |

FOREIGN PATENT DOCUMENTS

WO  WO 9953437 A1 * 10/1999

OTHER PUBLICATIONS

Newton's Telecom Dictionary, "Handshake" & "Relay", 2004, CMP Books 20th Edition, p. 385 & 694.*

* cited by examiner

*Primary Examiner* — Patrick Edouard
*Assistant Examiner* — Matthew Genack
(74) *Attorney, Agent, or Firm* — John D. Gugliotta, Pe, Esq

(57) ABSTRACT

A digital, wireless PC/PCS modem is disclosed for incorporation with personal home computers, laptop units, hand-held computer units, and cellular phones for providing wireless communication via satellite transmission. The invention is a device that combines a personal computer (PC) modem with a satellite link and relay system for computers. This will allow the user to establish a communications link with Internet™ access, access to direct dial telephones, faxing on demand, hyperterminal access for remote computer link-up, video, and voice applications. Utilizing existing software and hardware, this invention uses digital satellite technology and combines it with a PC modem for access to various communication links including phone links, without a phone line. In order to accomplish this, the laptop has a type II PCMCIA card slot for receiving the PC modem. An antenna is attached to the plug-in cellular phone card for the modem using a swivel joint assembly.

2 Claims, 6 Drawing Sheets

DIGITAL, WIRELESS PC/PCS MODEM

RELATED APPLICATIONS

The present invention is a Continuation in Part of Ser. No. 09/273,482, filed on Mar. 22, 1999 now abandoned.

BACKGROUND OF THE INVENTION

1. Field of the Invention

The present invention relates generally to data communications and, more particularly, to data communications for a laptop computer unit utilizing a PCMCIA (Personal Computer Memory/Card International Association (usually seen as PCMCIA, now PC Card) Card Type Modem.

2. Description of the Related Art

In the related art, combining cellular phone technology with computer data communications is well-known. Typically, a personal computer is equipped with a modem and coupled with a conventional cellular type phone to allow a personal computer user to set up a data link from a remote site without having to establish the link via a conventional modem connected to the Public Switched Telephone Network (PSTN). Instead, computer data is electronically converted by the modem into a format that can be transmitted by the cellular phone over the electromagnetic spectrum. This is highly desirable when connecting to a PSTN line is not convenient such as when one is traveling in the car or away from the home or office and wishes to connect to other computer(s) such as the office computer or the increasingly popular Internet. Not only may computer data be transmitted over the established data link but voice, fax and eventually video data may be transmitted as well giving the personal laptop user a variety of working tools remotely.

The problem with the systems in the related art is that none of the systems designed to date have a simple, universal, integrated modem and cellular transceiver that can be installed by simply inserting it into a conventional PCMCIA slot in a laptop computer.

A search of the prior art did not disclose any patents that read directly on the claims of the instant invention; however, the following references were considered related:

U.S. Pat. Nos. 5,787,363 to Scott et. al. and 5,570,369 to Rossi describe a system and method for connect message synchronization in a cellular data gateway. U.S. Pat. Nos. 5,479,480 to Scott and 4,654,867 to Labedz et al. disclose a cellular radio modem in analog and digital mode. U.S. Pat. Nos. 5,428,671 to Dykes et al. and 5,408,520 to Clark et al. disclose a modem with connections for land lines and cellular phones. U.S. Pat. Nos. 4,837,800 to Freeburg et al. and 4,697,281 to O'Sullivan describe a cellular data telephone system (CDT) including a data control unit, modem, telephone, antenna, and connects to a data terminal. U.S. Pat. No. 4,972,457 to O'Sullivan, discloses a laptop device with a cellular transceiver, speaker phone, and a hybrid communications control unit. U.S. Pat. No. 5,020,090 to Morris describes an apparatus for removably connecting a' cellular phone to a computer.

However, none of the references disclose a cellular transceiver integrated with a conventional Personal Computer (PC) modem card designed to fit into a conventional PCMCIA slot of a laptop computer as in the present invention. Nor is the manner of the proposed combination of the satellite link and relay technology and the modem the focus of the utilitarian aspect of these inventions.

In fact, with the exception of two, most of the references are vague as to exactly how the proposed combination of a cellular phone and a modem is to be accomplished. The '457 reference discloses a hybrid communications central processor mounted on a circuit board which fits into the card slot of a portable personal computer. The '457 reference teaches placing the cellular transceiver unit in the computer case in a space which might otherwise be occupied by a disk drive. This is clearly distinct from the present invention where the wireless transceiver is mounted on the card. The '090 reference discloses a laptop computer with a track built into the computer's housing for slidably receiving a commercially available cellular portable phone. Different mounting brackets for adapting said cellular phone to said track would allow cellular phones from various other manufacturers to be used.

However, both of these invention have drawbacks. Most portable laptop computers can ill afford to devote or even have an empty space for a device such as a hard drive to place another component such as a cellular transceiver into as suggested in '457. The proposed combination in '090 makes the laptop unit more bulky and no universal design of the slidably receiving track can accommodate all of the various style cellular phones and manufacturers.

The present invention eliminates all of these problems by combining a cellular transceiver with a conventional PCMCIA card type modem for insertion into a conventional PCMCIA modem slot on a laptop computer. The resulting invention is of a universal design that can be used in any laptop that has a conventional PCMCIA slot. No additional slots or bays are required on the laptop.

The present invention also has the antenna built into the card eliminating the need for an additional external antenna on the laptop computer case. The card then can be installed by inserting it into the PCMCIA slot and installing a software driver as provided by the manufacturer. The resulting combination will allow a laptop user to connect via the modem and transceiver to any host computer waiting for an incoming call.

The present invention further incorporates a microphone, a swivel-based micro camera, and a loudspeaker for transmitting not only computer and fax data, but voice and video data.

SUMMARY OF THE INVENTION

It is therefore an object of the present invention to provide a universal, PC/Personal Computer System (PCS) modem for use with a laptop unit, a desktop computer, hand-held unit, or cellular phone.

It is another feature of the present invention to provide a PC/PCS modem which can be inserted into a conventional PCMCIA slot of a laptop computer.

It is yet another feature of the present invention to provide an antenna for the transceiver integrated into the body of the device.

It is still yet another feature of the invention to provide a PC/PCS modem for use with a laptop or desktop computer that can be used remotely via the modem device built within it for transmitting and receiving computer, fax, voice, video datum and television broadcast via satellite link and relay system.

It is still yet another feature of the invention to be lightweight and affordable.

It is still yet another feature of the invention to be assembled from readily available electronic components.

It is still yet another feature of the invention to provide at least three tuner cards for providing a multi-task video screen split into a plurality of frames of equal dimension.

Briefly described according to one embodiment of the present invention, a PC/PCS laptop computer modem is provided. The device is assembled from readily available electronic components. The key feature is that both a modem and a wireless transceiver are provided on the circuit board holding the electronic components. At least three tuner cards are included which provides a multi-task video screen split into a plurality of frames of equal dimension. Each frame provides for a specific functional operation, task, or application. An antenna is also provided and is connected to the circuit board for transmitting and receiving the digital signals and sending them to the board to be processed.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

DESCRIPTION OF THE PREFERRED EMBODIMENT

1. Detailed Description of the Figures

Figure 1:
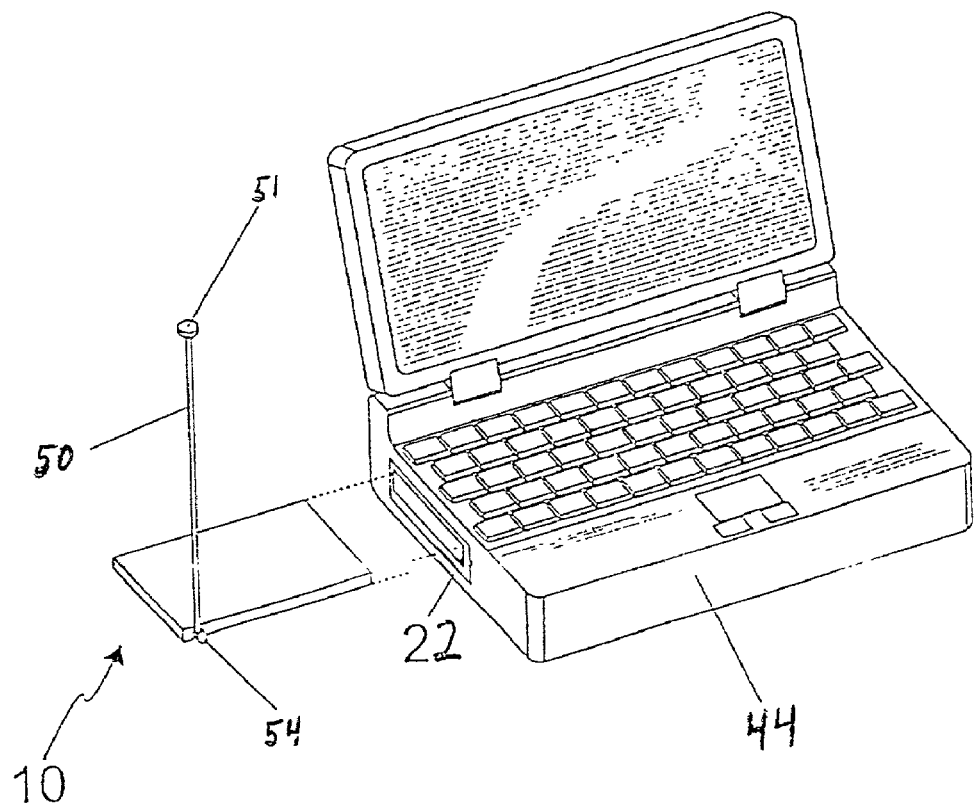
FIG. 1 is a perspective view of the preferred embodiment of a digital, wireless PC/PCS modem 10 shown in a removed state from a laptop computer unit 44.

Referring now to FIGS. 1-5, 7 and 8, a digital, wireless PC/PCS modem 10, hereinafter referred to as PC/PCS modem 10, is shown for incorporation with personal home computers 42, laptop units 44, hand-held computer units 46 and cellular phones 48 for providing wireless communication via satellite transmission. The PC/PCS modem 10 features the ability to transmit video, computer, voice, and fax data. The PC/PCS modem 10 is connected to a circuit board 20 which holds internal electronic components.

First, a description of the PC/PCS modem 10 for utilization with laptop units 44, hand-held computer units 46 and cellular phones 48 is disclosed henceforth.

Figure 3:
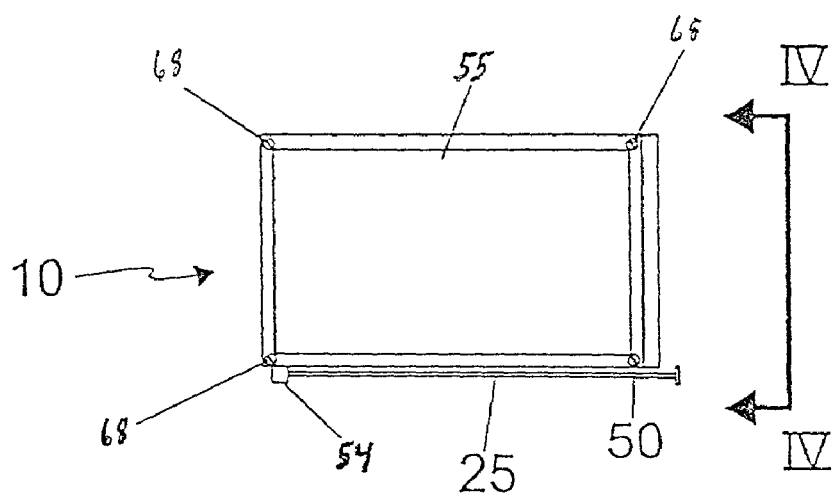
FIG. 3 is a top view of the digital, wireless PC/PCS modem 10.
Figure 4:
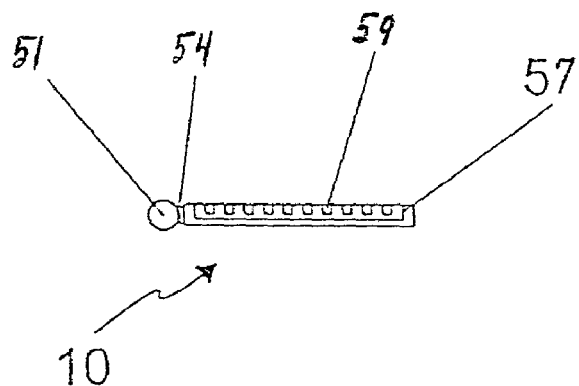
FIG. 4 is an end view of the digital, wireless PC/PCS modem 10 as seen along a line IV-IV in FIG. 3.

Referring now to FIGS. 1, 3, and 4, a PC/PCS modem 10 is shown in a removed state from a laptop unit 44. The PC/PCS modem 10 is in a PCMCIA card type configuration universally known in the art as associated with a laptop unit 44. The PC/PCS modem 10 would connect into the laptop unit 44 using a type II PCMCIA card slot 22. A perspective view of the PC/PCS modem 10 is shown in FIG. in a utilized state with the PC/PCS modem 10 fully seated in the type II PCMCIA card slot 22 of the laptop unit 44.

Figure 7:
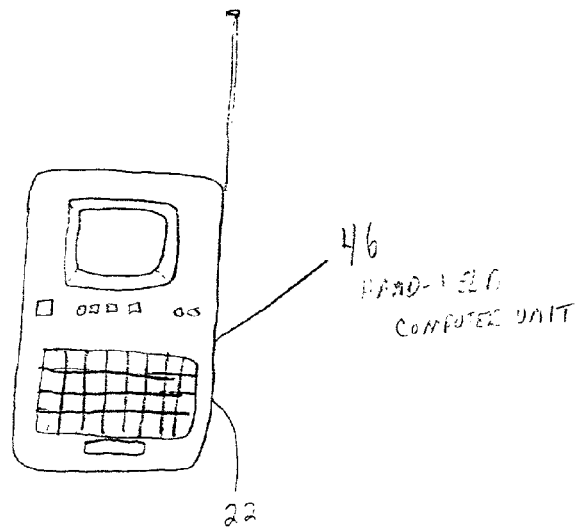
FIG. 7 is a perspective view of a hand-held computer unit.
Figure 8:
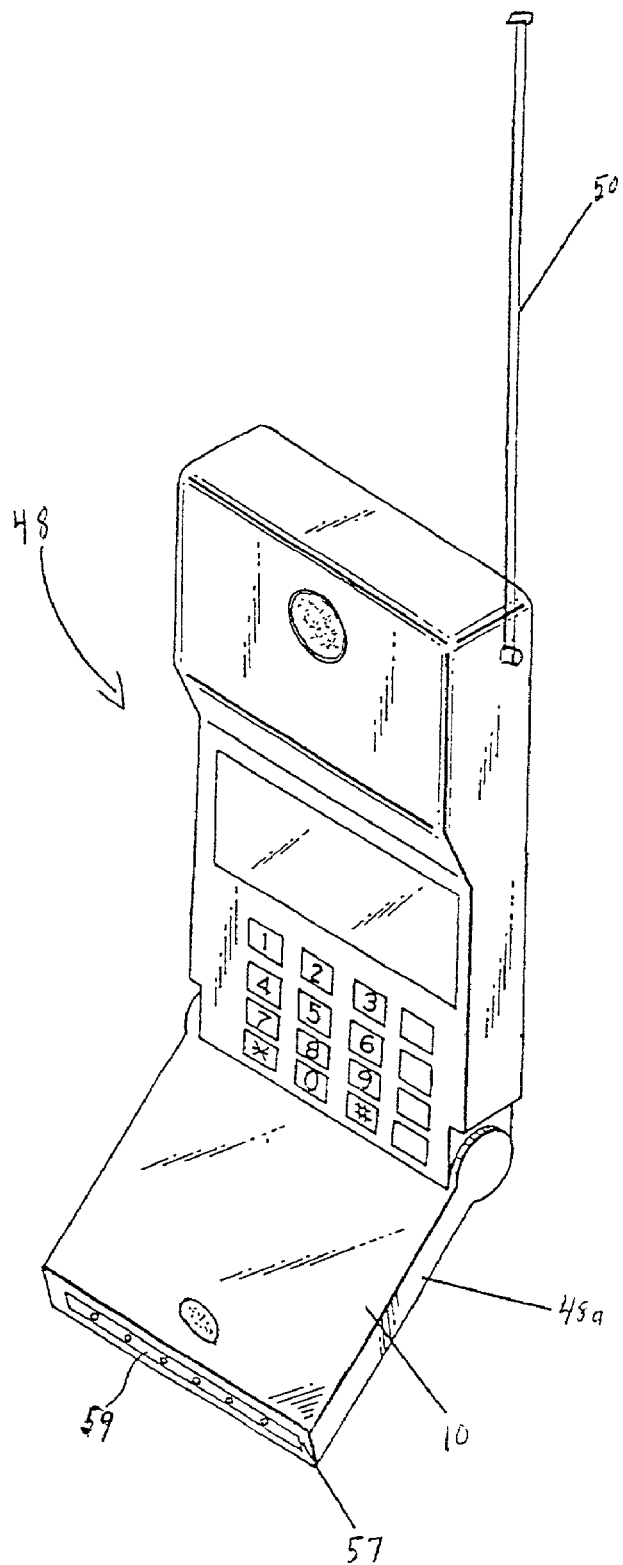
FIG. 8 is a perspective view of a cellular phone unit.

Referring more specifically to FIGS. 7 and 8, for purposes of this disclosure, it is envisioned that the hand-held computer unit 46 is designed and configured as having a type II PCMCIA card slot 22 for receiving the PC/PCS modem 10. It is further envisioned that the cellular phone 48 is designed and configured with a PC/PCS modem 10 hingedly attached as a free end 48a with an electrical connector 57 comprising a series of electrical contacts 59, wherein the free end 48a is scaled equivalent to the aforementioned PC/PCS modem 10 for engaging the type II PCMCIA card slot 22.

An antenna 50, complete with a protective cap 51, is provided and tuned to the frequency of a corresponding satellite link and relay wireless system for transmitting and receiving digital signals and sending them to the circuit board 20 to be processed. Such a system allows transference of datum and other services from the laptop unit 44 from home or while traveling. The antenna 50 is attached to the PC/PCS modem 10 using a swivel joint assembly 54. The swivel joint assembly 54 allows for the antenna 50 to be rotated and aligned to provide optimum transmission and reception of digital signals unlimited with respect to user's locale. The antenna 50 is designed and configured so as to minimize interferencial effects suffered by satellite link and relay wireless communications which commonly occur during storms, while maintaining maximum performance.

The swivel joint assembly 54 is shown providing for the antenna 50 to be in a collapsed position. Such collapsed position facilitates storage and transportability of the laptop unit 44, the hand-held unit 46, and the cellular phone 48.

It should be noted that the orientation of the antenna 50 with respect to the PC/PCS modem 10 and the orientation of the PC/PCS modem 10 with respect to the laptop unit 44 is for purposes of clarity only and is not intended to be a limiting factor.

Referring now to FIG. 3, a top view of the PC/PCS modem 10 is disclosed. The PC/PCS modem 10 is supplied in the standard shape, size and configuration to match the PCMCIA standards as developed by the computer industry. An enclosure top 55 is held in place by a series of fastening means 68, such as a screw. The enclosure top 55 is removable to allow for repair or adjustment of any internal electronic components located inside the PC/PCS modem 10.

Referring now to FIG. 4, along the leading edge of the PC/PCS modem 10 is an electrical connector 57, comprising a series of electrical contacts 59. The electrical connector 57 would be of the standard arrangement as defined by the computer industry for PCMCIA connections.

Figure 5:
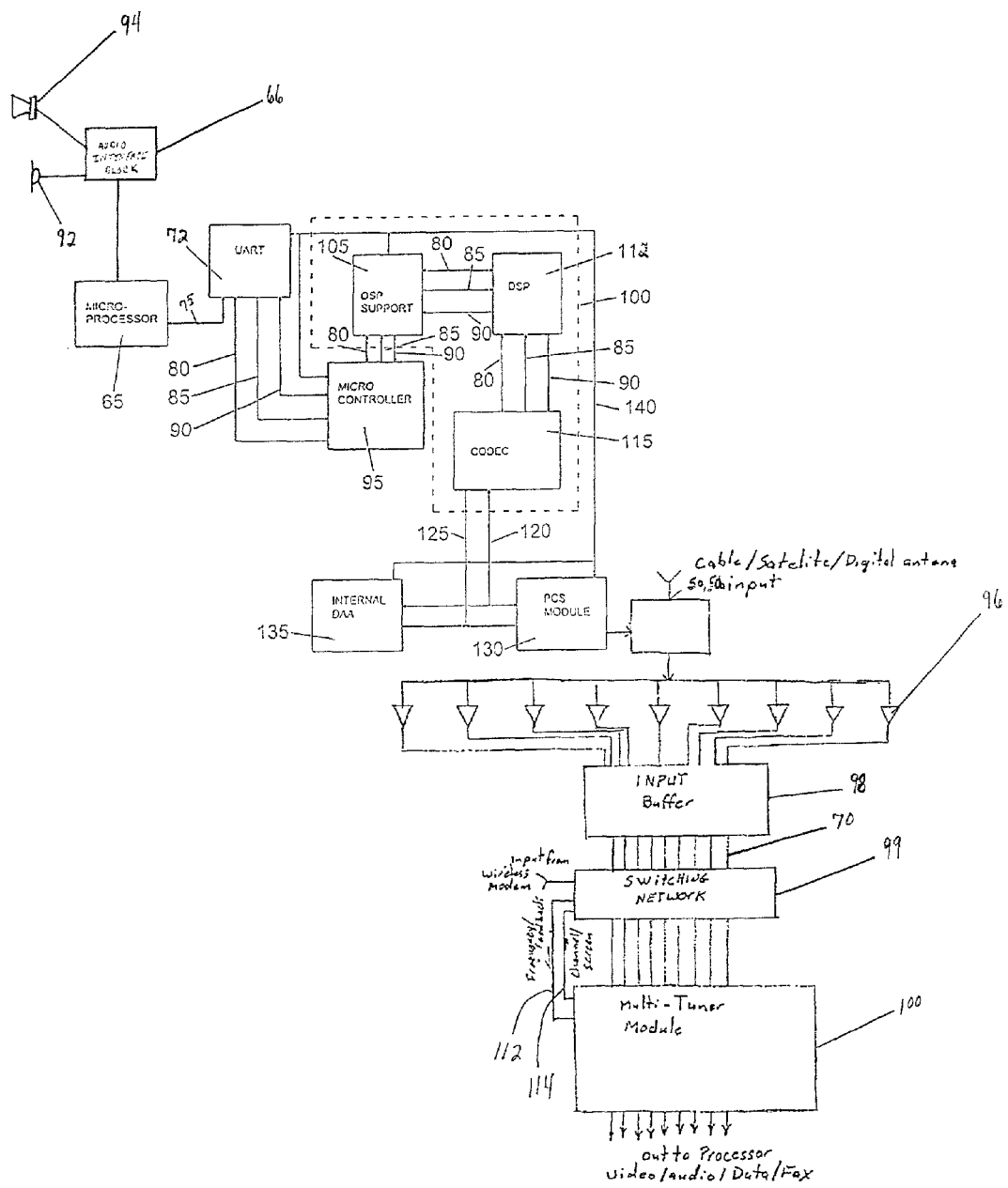
FIG. 5 is an electrical schematic block diagram depicting the circuitry associated with the present invention.

Referring next to FIG. 5, according to the preferred embodiment of the present invention, the laptop unit 44 is provided with at least three tuner cards 70 for providing a multi-task video screen 80 split into a plurality of frames 82 of equal dimension, wherein each frame 82 providing for a specific functional operation, task, or application.

Figure 2:
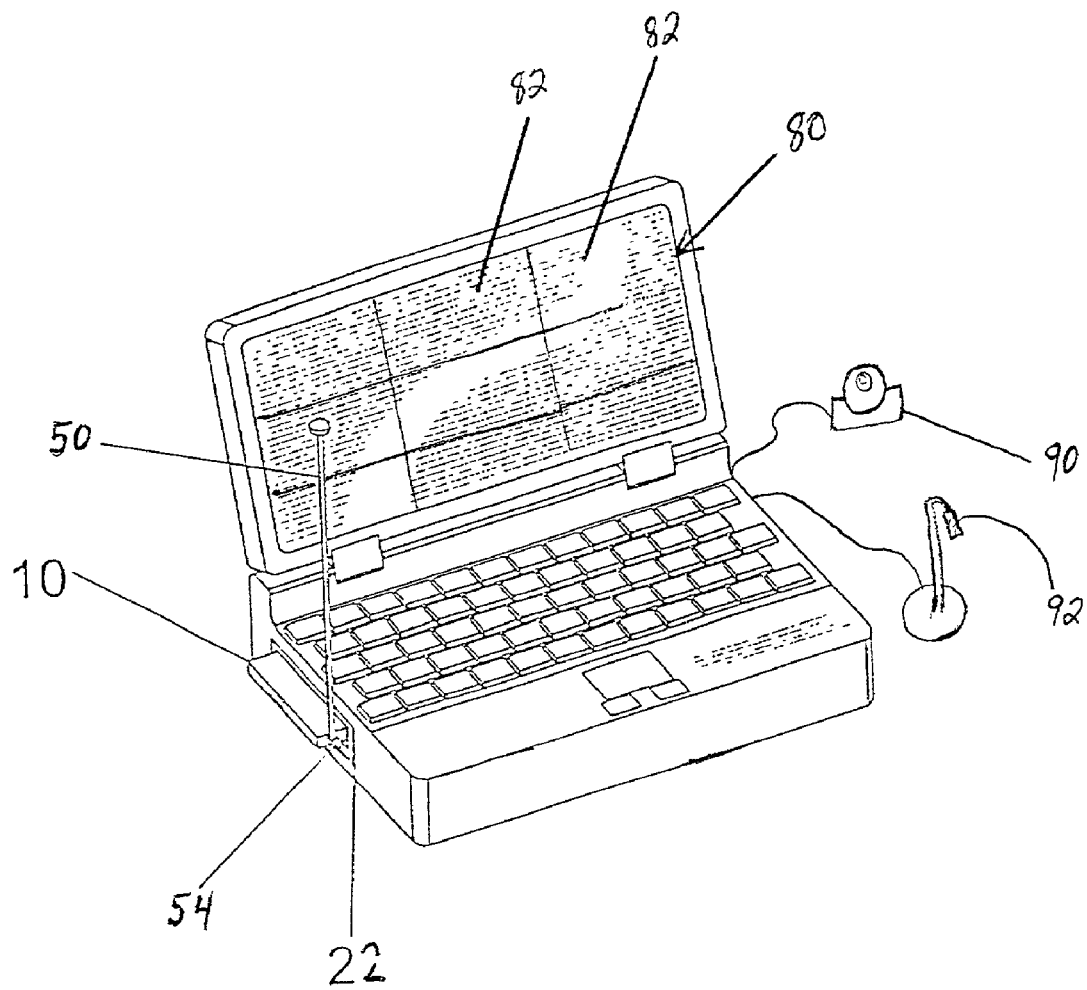
FIG. 2 is a perspective view of the digital, wireless PC/PCS modem 10 shown in a utilized state in the laptop unit 44.

Specifically referring to FIGS. 2 and 5, for purposes of this disclosure, the preferred embodiment is shown and described as having nine tuner cards 70 thus providing a multi-task video screen 80 split into nine frames of equal dimension, wherein each frame providing for a specific functional operation, task, or application.

In operation, the tuner cards 70 provide the user with the capability of performing various functional operations and transmissions including video, voice, text, fax, and viewing of satellite television broadcast, while all nine frames 82 being simultaneously displayed via the multi-task video screen 80.

Video transmission is accomplished via a swivel-based, independent micro camera 90 rotatable 180°.

A microphone 92 is provided for converting a transmitted sound into a sound signal, wherein the sound signal is further converted into a transmitting signal which is transmitted through the antenna 50, 50a.

A loudspeaker 94 is provided for generating an audible sound in response to reception of digital signals. The loudspeaker 94 and the microphone 92 are coupled to a microprocessor 65 via an audio interface block 66.

Figure 6:
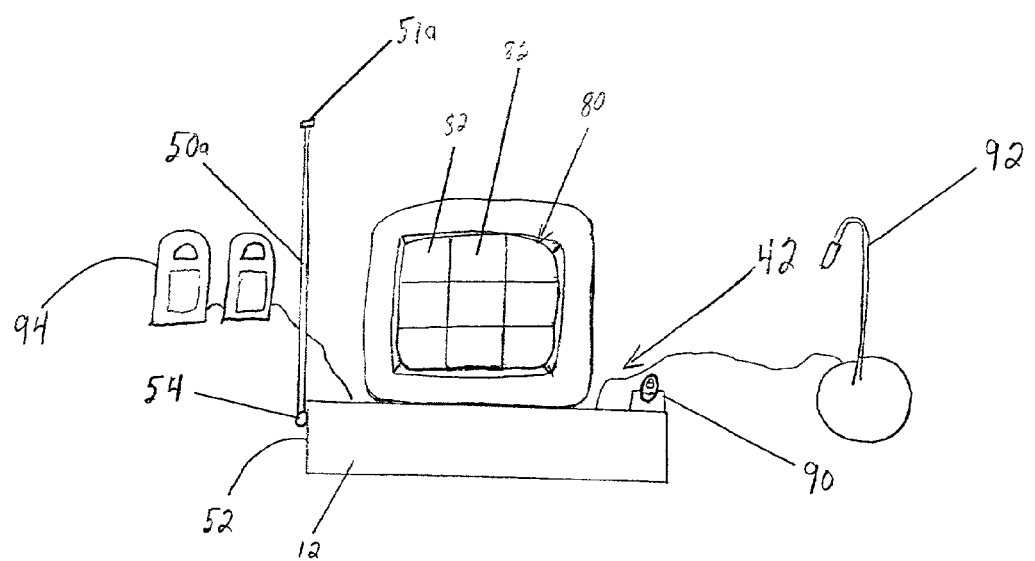
FIG. 6 is a perspective view of a personal home computer.

Referring now to FIG. 6, an alternate embodiment of the present invention is disclosed, wherein an integrated PC/PCS digital wireless modem 12, hereinafter referred to as integrated PC/PCS modem 12, is shown for incorporation within personal home computers 42 for providing wireless communication via satellite transmission. The integrated PC/PCS modem 12 features the ability to transmit video, computer, voice, and fax data. An antenna 50a is provided and is connected to the integrated PC/PCS modem 12 for transmitting and receiving digital signals and sending them to the circuit board 20 to be processed. The antenna 50a, complete with a protective cap 51a, is provided and operatively tuned so as to allow transmission to a corresponding satellite link and relay wireless system.

The antenna 50a is attached to an external housing 52 of the personal home computer 42 using a swivel joint assembly 54 which allows for the antenna 50a to be rotated and aligned to provide optimum transmission and reception of digital signals unlimited with respect to user's locale. The antenna 50a is designed and configured so as to minimize interferencial effects suffered by satellite link and relay wireless communications which commonly occur during storms, while maintaining maximum performance. It should be noted that the orientation of the antenna 50a with respect to its attachment location as illustrated in FIGS., is for purposes of clarity and is not intended to be a limiting factor.

Specifically referring to FIGS. 5 and 6, the alternate embodiment of the present invention is provided with at least three tuner cards for providing a multi-task video screen 80 split into a plurality of frames 82 of equal dimension, wherein each frame 82 providing for a specific functional operation, task, or application such as video, voice, text, fax, and viewing of satellite television broadcast. The alternate embodiment of the present invention is shown and described as having nine tuner cards 70.

Video transmission is accomplished via a swivel-based micro camera 90 rotatable 180°.

A microphone 92 is provided for converting a transmitted sound into a sound signal, wherein the sound signal is further converted into a transmitting signal which is transmitted through the antenna 50, 50a.

A loudspeaker 94 is provided for generating an audible sound in response to reception of digital signals. The loudspeaker 94 and the microphone 92 are coupled to a microprocessor 65 via an audio interface block 66.

Referring next to FIG. 5, a description regarding circuitry associated with the PC/PCS modem 10 incorporated with the laptop unit 44 is disclosed. It should be noted; however, that the circuitry to be described henceforth is intended to be equally applicable to the alternate embodiment of the present invention. Digital signals transmitted via satellite link and relay wireless system is received by the antenna 50 and are passed therefrom through a series of line amplifiers 96. An input buffer 98 is coupled between the series of line amplifiers 96 and a network switching element 99, which receives input from the PC/PCS modem 10. Frequency/Feedback 112 along with Channel/Screen selection function 114 flows from the switching network element 99 bi-directionally to a multi-tuner module 100 where data is passed therefrom to the microprocessor 65. This data is then passed on to a universal asynchronous receiver transmitter 72 via a first bi-directional path 75. The universal asynchronous receiver transmitter 72 is responsible for all data transfers from the computer system to its modem output system. This described data transfer occurs between these and all modules through a series of parallel bus 80, a series of serial transmit bus 85 and a series of serial receive bus 90. The first of these occurs with a micro controller 95. The micro controller 95 is dedicated to aligning the data in the proper configuration to be processed by a voice, audio, data, fax and video processor 110 (indicated by a dashed box) through another parallel bus 80, serial transmit bus 85 and serial receive bus 90. The voice, data, fax and video processor 110 consists of a digital signal processing support module 105, used as a prebuffer into a digital signal processor 112. The digital signal processor 110 performs all necessary operations on the data, including handshake verification, through a series of built in algorithms. It is envisioned that the algorithms would be software ungradable to allow for future enhancements in wireless communications standards. Data from the digital signal processor 112 is then passed to a coding-decoding device 115 where it is assembled into data packets. Data from the coding-decoding device 115 is transferred on a transmit "A" line 120 and a receive "A" line 125 to a PCS module 130 and an internal data access arrangement 135. The PCS module 130 provides the necessary interface to the wireless personal communication system through the antenna 50 and will be internally programmable with regards to calling systems, phone numbers, data transfer protocols, system requirements and the like. It will be password protected to only allow authorized sellers to program the above variables. It is envisioned that this programming and reprogramming will occur separate from the laptop unit 44 (not shown in this FIG.) through a special interface. The internal data access arrangement 135 is in physical connection to a particular phone system and is envisioned to allow for specific system dependent items such as special ring requirements, caller identification and other host specific items. A switched data bus 140 shown as interconnecting to the universal asynchronous receiver transmitter 72, the digital signal processing support module 105, the PCS module 130, and the internal data access arrangement 135 allow for data acknowledgment and step transfer functions for data that is communicated on the serial busses. It should be noted that data transfers through all blocks in a bidirectional pattern as would be occurring during downloading and uploading of information.

It is envisioned that other styles and configurations of the present invention can be easily incorporated into the teachings of the present invention, and only one particular configuration will be shown and described for purposes of clarity and disclosure and not by way of limitation of scope.

2. Operation of the Preferred Embodiment

The present invention is designed with ease of operation features in mind that allow it to be set and utilized by a common individual with little or no training, and operated in a transparent and intuitive manner with respect to conventional hard-wired modems as used with laptop computers.

To use the present invention, the user would select a PC/PCS modem capable of providing wireless communication via satellite transmission for incorporation with a laptop unit. The user then inserts the selected PC/PCS modem into the type II PCMCIA card slot of the laptop unit. Next, the appropriate communication software such as dial-up satellite networking, remote access software, or similar software would be accessed using the operating system of the laptop unit. After the necessary software has initialized, and the PC/PCS modem is chosen as the connection means, a series of data packets will be exchanged to initialize a connection with a satellite link and relay wireless network. The PC/PCS modem will provide the interface connection between the laptop unit and the wireless network. At this point, the user is free to begin the necessary data, voice, video, and fax exchange in a manner identical to that which would be used with a direct hard-wired network connection.

After completion of the necessary data exchange, the communication link would be disconnected in the normal fashion using the disconnect feature of the above-mentioned communication software. At this point the user may remove the PC/PCS modem from the laptop unit. If another connection is desired with the same satellite network, the above mentioned procedure would be repeated.

Therefore, the foregoing description is included to illustrate the operation of the preferred embodiment and is not meant to limit the scope of the invention. As one can envision, an individual skilled in the relevant art, in conjunction with the present teachings, would be capable of incorporating many minor modifications that are anticipated within this disclosure. Therefore, the scope of the invention is to be broadly limited only by the following claims.

What is claimed is:

1. A method to utilize a digital, wireless PC/PCS modem having an antenna attached to a PCMCIA card-type interface in communication with an integrated circuit board, said modem works in conjunction with a computer provided with a swivel-based camera, a microphone and at least three tuner cards to relay wireless communications via satellite, said method comprises the steps:

passing digital signals transmitted via a satellite link and a wireless relay system from said antenna that receives said signals to a series of line amplifiers, said series of line amplifiers and a network switching element have an input buffer coupled therebetween, said network switching element receives input from said PC/PCS modem, said network switching element has a frequency/feedback along with a channel/screen selection function flowing from said switching network bi-directionally to a multi-tuner;

passing data received from said multi-tuner module to a microprocessor; and passing said data on to a universal asynchronous receiver transmitter via a first bi-directional path, said universal asynchronous receiver transmitter is responsible for all data transfers from a computer system to the computer system's modem output system, wherein said data transfer occurs between all modules through a series of parallel bus, a series of serial transmit bus and a series of serial receive bus.

2. The method in claim 1 further comprises the steps:

aligning said data in a proper configuration by means of a micro controller;

processing said proper configuration by means of a voice, a data, a fax and a video processor through a second parallel bus, a second serial transmit bus and a second serial receive bus, said voice, data, fax and video processor includes a digital signal processing support module used as a prebuffer into a digital signal processor, and wherein said digital signal processor performs all necessary operations on said data, including handshake verification, through a series of built-in algorithms.

* * * * *